(12) United States Patent
Oh

(10) Patent No.: US 10,892,627 B2
(45) Date of Patent: Jan. 12, 2021

(54) LEARNING ALGORITHM FOR CONTROLLING THE VOLTAGE OF BATTERY

(71) Applicants: HYUNDAI MOTOR COMPANY, Seoul (KR); KIA MOTORS CORPORATION, Seoul (KR)

(72) Inventor: Hong-Min Oh, Yongin-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 427 days.

(21) Appl. No.: 15/807,358

(22) Filed: Nov. 8, 2017

(65) Prior Publication Data

US 2018/0326859 A1   Nov. 15, 2018

(30) Foreign Application Priority Data

May 12, 2017   (KR) .......................... 10-2017-0059358

(51) Int. Cl.
| | | |
|---|---|---|
| *H02J 7/00* | (2006.01) | |
| *B60L 11/18* | (2006.01) | |
| *B60R 16/033* | (2006.01) | |
| *G01R 31/34* | (2020.01) | |
| *H02J 7/14* | (2006.01) | |
| *G01R 31/50* | (2020.01) | |
| *B60W 10/26* | (2006.01) | |

(52) U.S. Cl.
CPC ......... *H02J 7/0047* (2013.01); *B60L 11/1861* (2013.01); *B60R 16/033* (2013.01); *G01R 31/343* (2013.01); *G01R 31/50* (2020.01); *H02J 7/1438* (2013.01); *H02J 7/1461* (2013.01); *B60L 2240/547* (2013.01); *B60W 10/26* (2013.01)

(58) Field of Classification Search
CPC ....................................................... H02J 7/0047
USPC ......................................................... 320/132
See application file for complete search history.

(56) References Cited

U.S. PATENT DOCUMENTS

| | | | |
|---|---|---|---|
| 5,796,334 A * | 8/1998 | Chen ...................... | G06K 1/128 307/10.7 |
| 7,443,143 B2 | 10/2008 | Sasaki et al. | |

(Continued)

FOREIGN PATENT DOCUMENTS

| | | |
|---|---|---|
| JP | 5024626 B2 | 9/2012 |
| JP | 2016-131488 A | 7/2016 |

*Primary Examiner* — Yalkew Fantu
(74) *Attorney, Agent, or Firm* — Morgan, Lewis & Bockius LLP

(57) ABSTRACT

A learning algorithm for controlling a battery voltage, which reduces an error of the battery voltage by using a power generation voltage of an alternator while a vehicle is driven includes steps of: calculating, by a processor, a first error voltage indicating a difference between the power generation voltage of the alternator and the battery voltage after the vehicle has been assembled; calculating, by the processor, a second error voltage indicated by updating the difference between the power generation voltage of the alternator and the battery voltage according to an output amount of the alternator and a driving time; and calculating, by the processor, a line-to-line voltage between the alternator and the battery by adding the first error voltage and the second error voltage. This learning algorithm is advantageous since there is no side effect in voltage control such as open-loop control and there is a low voltage control error.

5 Claims, 4 Drawing Sheets

(56) References Cited

U.S. PATENT DOCUMENTS

| | | | | |
|---|---|---|---|---|
| 8,054,046 B2 * | 11/2011 | Lin | ................... | H01M 10/482 |
| | | | | 320/156 |
| 9,156,467 B2 | 10/2015 | Tani et al. | | |
| 9,168,881 B2 | 10/2015 | Garofalo et al. | | |
| 2002/0075015 A1 * | 6/2002 | Morimoto | ............ | G01R 31/396 |
| | | | | 324/672 |
| 2003/0052688 A1 * | 3/2003 | Yudahira | .............. | G01R 31/396 |
| | | | | 324/429 |
| 2004/0164709 A1 * | 8/2004 | Kapsokavathis | ..... | H02J 7/1461 |
| | | | | 320/132 |
| 2014/0361743 A1 * | 12/2014 | Lin | ...................... | H02J 7/0014 |
| | | | | 320/109 |

* cited by examiner

FIG 4

| SECOND ERROR VOLTAGE [ V ] | | DRIVING TIME | | |
|---|---|---|---|---|
| | | 0 TO 20 MINUTES | 20 TO 40 MINUTES | 40 MINUTES OR MORE |
| OUTPUT AMOUNT OF ALTERNATOR | HIGH | K1 | K2 | K3 |
| | MEDIUM | K4 | K5 | K6 |
| | LOW | K7 | K8 | K9 |

LEARNING ALGORITHM FOR CONTROLLING THE VOLTAGE OF BATTERY

CROSS-REFERENCE TO RELATED APPLICATIONS

This application is based on and claims the benefit of priority under 35 U.S.C. § 119 to Korean Patent Application No. 10-2017-0059358, filed on May 12, 2017, in the Korean Intellectual Property Office, the entire disclosure of which is incorporated herein by reference.

TECHNICAL FIELD

The present disclosure relates to a learning algorithm for controlling a voltage of a battery, and particularly, to a learning algorithm for controlling a voltage of a battery, which calculates a line-to-line voltage from an alternator up to a battery to minimize an error of the battery.

BACKGROUND

In general, various electric loads including a starter motor used for starting an engine and light devices such as a headlight, a tail lamp, and a brake light are mounted on a vehicle. A battery is mounted on the vehicle in order to supply operating power to the electric loads, and charging power of the mounted battery is supplied to the electric loads. However, the battery is limited in charging power which the battery may supply to the electric loads. Therefore, an alternator capable of generating power is mounted in the vehicle and the power generated from the alternator is charged in the battery to continuously supply the operating power to the electric loads.

In a past power system that does not a power generating control system and/or an idle stop & go (ISG) system, as system voltage of the vehicle, a battery voltage and each unit is automatically determined by a voltage generated by the alternator. However, as the power generating control system and/or the ISG system are applied, the battery voltage needs to be adjusted and a voltage control scheme is changed to receive feedback of the battery voltage through a battery sensor more accurately to control the battery voltage by a proportion-integral (PI) control scheme.

In this regard, Korean Patent Registration No. 10-1438330 (Method for Alternator Control Using Battery Sensor and Method Thereof) in the related art discloses a method for controlling an alternator using a battery sensor, which can verify reliability of a battery in a general internal combustion engine vehicle and control the alternator within a range in which the battery is not influenced.

However, the related art has a disadvantage in that a sensor is required in the battery, and the reliability of the battery is not assured and error of the battery voltage cannot be substantially minimized.

SUMMARY

The present disclosure has been made in an effort to provide a learning algorithm capable of minimizing a battery voltage control error under an open-loop control condition.

An exemplary embodiment of the present disclosure provides a learning algorithm for controlling a battery voltage, which reduces an error of the battery voltage by using a power generation voltage of an alternator while a vehicle is driven, the learning algorithm including steps of: calculating, by a processor, a first error voltage indicating a difference between the power generation voltage of the alternator and the battery voltage after the vehicle is assembled; calculating, by the processor, a second error voltage indicated by updating the difference between the power generation voltage of the alternator and the battery voltage according to an output amount of the alternator and a driving time; and calculating, by the processor, a line-to-line voltage between the alternator and the battery by adding the first error voltage and the second error voltage.

An error between a target voltage and an actual voltage of the battery voltage may be reduced by removing the line-to-line voltage from the power generation voltage of the alternator.

The step of calculating a first error voltage may include determining whether there is a learning history of the vehicle, and terminating learning history when there is the learning history and determining whether an engine is in an idle state when there is no learning history, and the first error voltage may be calculated only when values of loads connected to the alternator are smaller than predetermined resistance in the idle state of the engine.

The step of calculating a second error voltage may include determining whether the engine is in an idle state, and may be performed in the idle state of the engine.

The second error voltage may be calculated by adding a predetermined second error voltage to a value acquired by applying a weighted value to the difference between the target voltage and the actual voltage of the battery, and updated for each idle section of the engine while the vehicle is driven.

According to an exemplary embodiment of the present disclosure, which has the above configuration, it is advantageous in that there is no side effect in voltage control such as open-loop control and there is a low voltage control error.

BRIEF DESCRIPTION OF THE DRAWINGS

FIG. 4 is a table of updating the second error voltage according to a driving state as the exemplary embodiment of the present disclosure.

DETAILED DESCRIPTION

Figure 1:
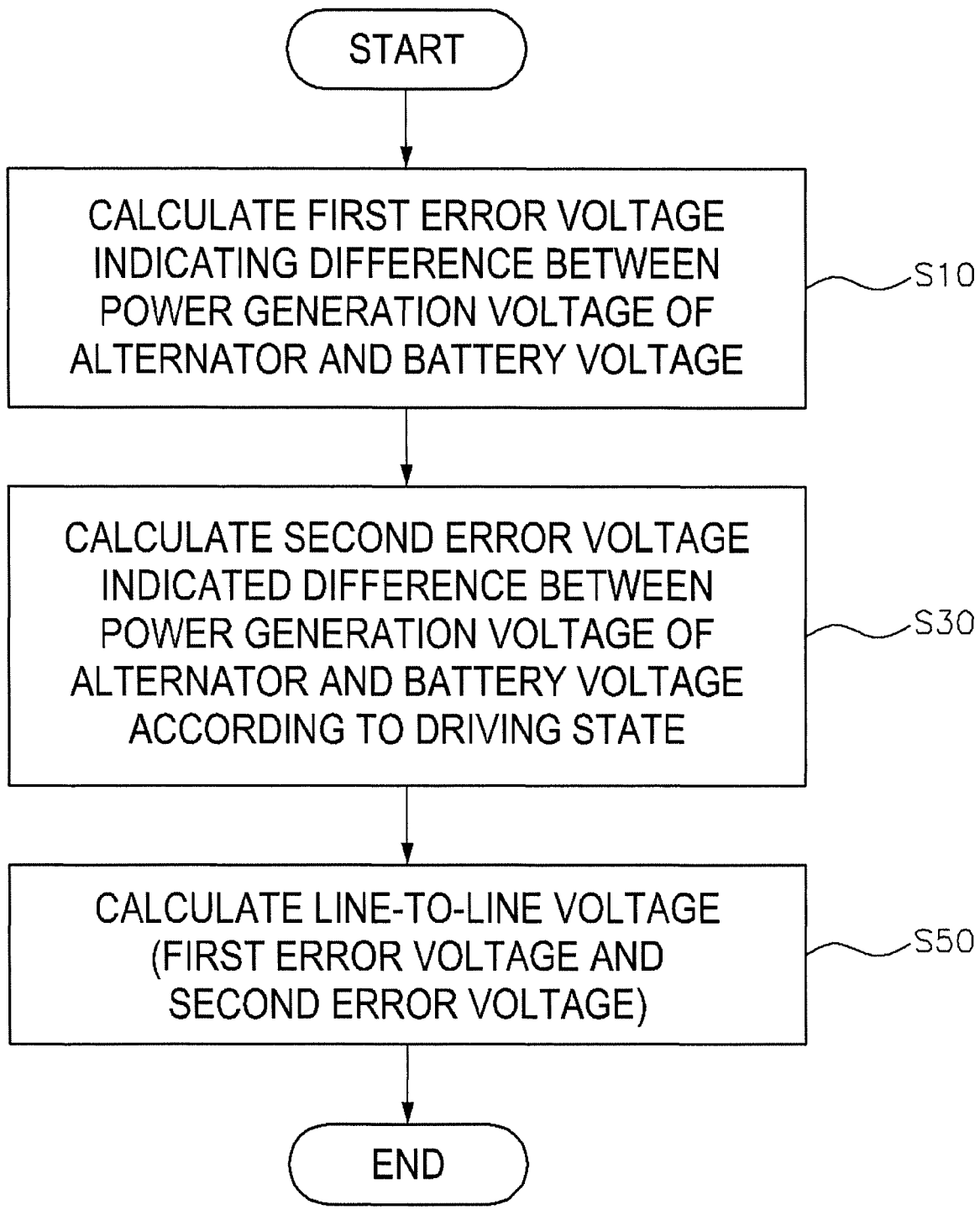
FIG. 1 is a flowchart of a learning algorithm for controlling the voltage of a battery according to an exemplary embodiment of the present disclosure.

Hereinafter, the present disclosure will be described in detail with reference to contents disclosed in the accompanying drawings. However, the present disclosure is not restricted or limited by exemplary embodiments. Like reference numerals presented in each drawing refer to elements that perform substantially the same functions.

Objects and effects of the present disclosure may be naturally appreciated or more clear by the following description and the objects and effects of the present disclosure are not limited only by the following disclosure. Further, in describing the present disclosure, a detailed explanation of known technologies associated with the present disclosure may be omitted to avoid unnecessarily obscuring the subject matter of the present disclosure.

In a past power system without a power generating control system and/or an idle stop & go (ISG) system, a system voltage of a vehicle, a power voltage of a battery and each unit is automatically determined by a voltage generated by an alternator. However, as the power generating control system and/or the ISG system are applied, the battery voltage needs to be adjusted and a voltage control scheme is changed to receive feedback of the battery voltage through a battery sensor more accurately to control the battery voltage by a proportion-integral (PI) control scheme.

However, in a battery charging voltage PI control scheme, as an output of the alternator is adjusted in real time with respect to a battery voltage error, an excessive idle vibration or a lamp dimming problem can occur in an engine of a small-sized vehicle, which produces low torque. Therefore, in a small-sized vehicle type, a battery voltage control method is changed to determine a power generation voltage through an open-loop control instead of the PI voltage control, but tuning is required for each vehicle type and, as the size (i.e., an alternator power generation amount) of an electric load amount increases, an error of an actual battery voltage becomes larger than a target battery voltage.

When the alternator generates power, a line-to-line voltage drop has a characteristic in that, for example, 'alternator voltage>battery voltage>both-terminal voltage of electric load'. In the case of the size of the line-to-line voltage drop, (1) as an amplitude of power generation current increases, the line-to-line voltage drop intends to increase and (2) as an ambient temperature of an electric wire increases, the line-to-line voltage drop intends to increase.

Therefore, in the present disclosure, under a formula of 'alternator voltage=battery voltage+line-to-line voltage', the line-to-line voltage is calculated while being divided into a first error voltage and a second error voltage.

FIG. 1 is a flowchart of a learning algorithm for controlling the voltage of a battery according to an exemplary embodiment of the present disclosure. Referring to FIG. 1, the learning algorithm for controlling the voltage of a battery may include steps of calculating the first error voltage (S10), calculating the second error voltage (S30), and calculating the line-to-line voltage (S50).

The above steps S10, S30, and S50 are executed by a processor, and the processor is an electric circuitry that executes software instructions stored in an associated non-transitory memory and thereby performs various functions described hereinafter.

The step of calculating the first error voltage (S10) is a process that calculates a difference between the power generation voltage of the alternator and the battery voltage after a vehicle is manufactured in the learning algorithm for controlling the voltage of a battery, which reduces an error of the battery voltage by using the power generation voltage of the alternator while the vehicle is driven.

The step of calculating the second error voltage (S30) is a process that updates and illustrates the difference between the power generation voltage of the alternator and the battery voltage according to an output amount of the alternator and a driving time.

Last, the step of calculating the line-to-line voltage (S50) is a process that calculates the line-to-line voltage between the alternator and the battery by adding the first error voltage and the second error voltage.

Through the above three steps according to the exemplary embodiment of the present disclosure, an error between a target voltage and an actual voltage of the battery may be reduced by removing the line-to-line voltage from the power generation voltage of the alternator.

Figure 2:
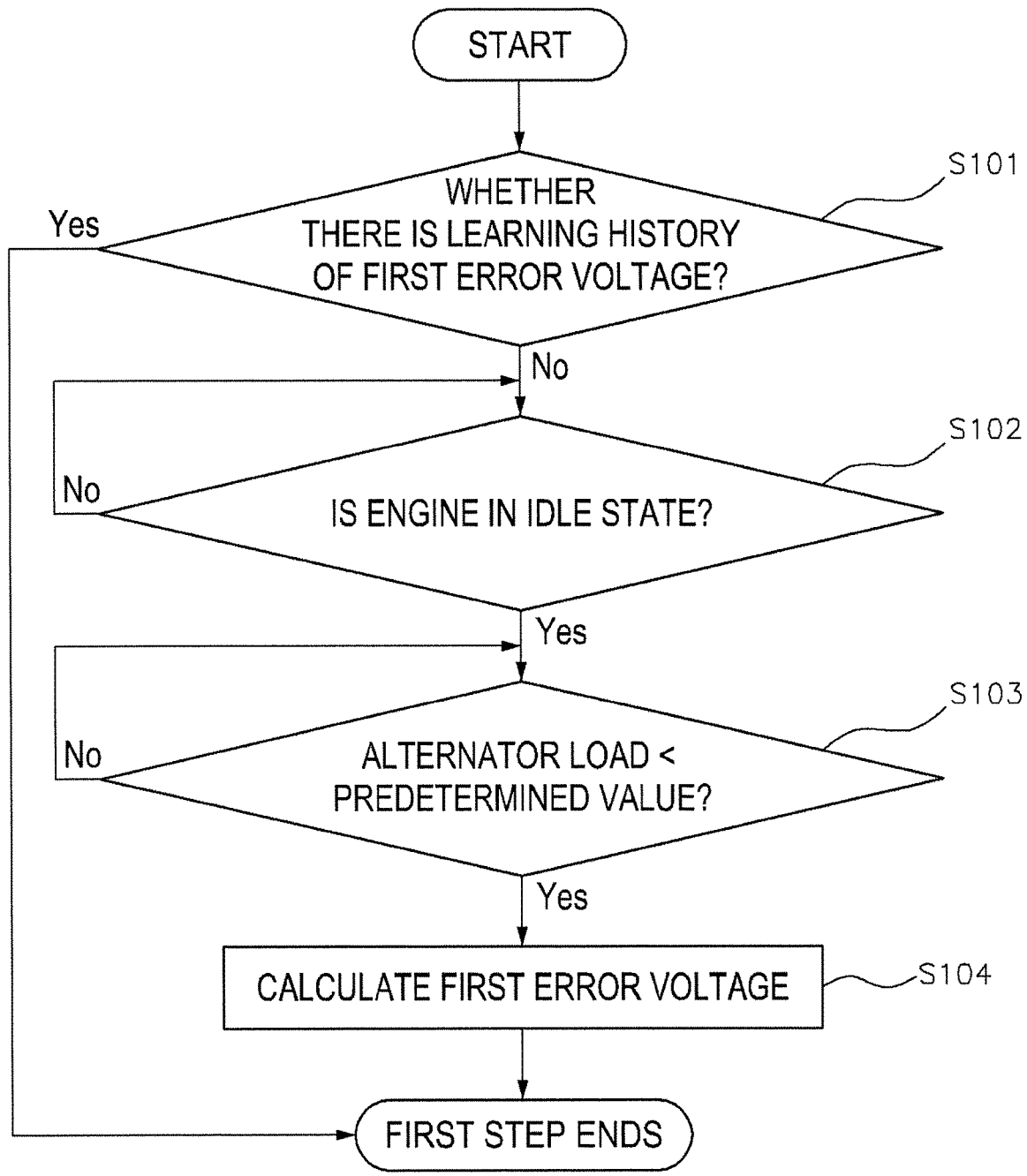
FIG. 2 is a flowchart of a step of calculating first error voltage according to the exemplary embodiment of the present disclosure.

FIG. 2 is a flowchart of the step of calculating a first error voltage according to an exemplary embodiment of the present disclosure. Referring to FIG. 2, the step of calculating a first error voltage (S10) may include: a process (S101) of determining whether there is a learning history of the vehicle; and a process (S102) of terminating learning when there is the learning history and determining whether an engine is in an idle state when there is no learning history. In the step of calculating the first error voltage (S10), the first error voltage may be calculated only when values of loads connected to the alternator are smaller than predetermined resistance in the idle state of the engine. The step of calculating the first error voltage (S10) may further include: determining whether the values of the loads connected to the alternator are smaller than the predetermined resistance (S103); and calculating the first error voltage (S104). The process (S101) of determining whether there is the learning history of the vehicle is used for measuring the first error voltage only once for the first time after the vehicle has been assembled. In the process of calculating the first error voltage by measuring the difference between the alternator voltage and the battery target voltage, the first error voltage is measured only once for the first time after the vehicle has been assembled instead of the tuning because a circuit configuration, a length of a circuit, and a thickness are all different according to the vehicle type. The first error voltage is measured to standardize the line-to-line voltage for each vehicle before measuring the second error voltage to update the line-to-line voltage according to a driving condition.

The process (S102) of determining whether the engine is in the idle state is used for measuring the first error voltage by accurately measuring the power generation voltage of the alternator and the process may be performed only when the engine is in the idle state.

The process is performed only when the values of the loads connected to the alternator are smaller than the predetermined resistance (small criterion) and the process for improving the error of the open loop control of a small-sized vehicle type is not performed when the load is larger than the predetermined resistance.

When the values of the loads connected to the alternator are described according to consumed current, the values may be measured as a small value (an error of 0.1 V is generated at 10 to 20 A), a medium value (an error of 0.2 V is generated at 30 to 40 A), and a large value (an error of 0.3 V is generated at 50 A or more) based on a compact vehicle according to the exemplary embodiment of the present disclosure and the line-to-line voltage may vary depending on the sizes of the loads and the errors may be shown to be different from each other.

Figure 3:
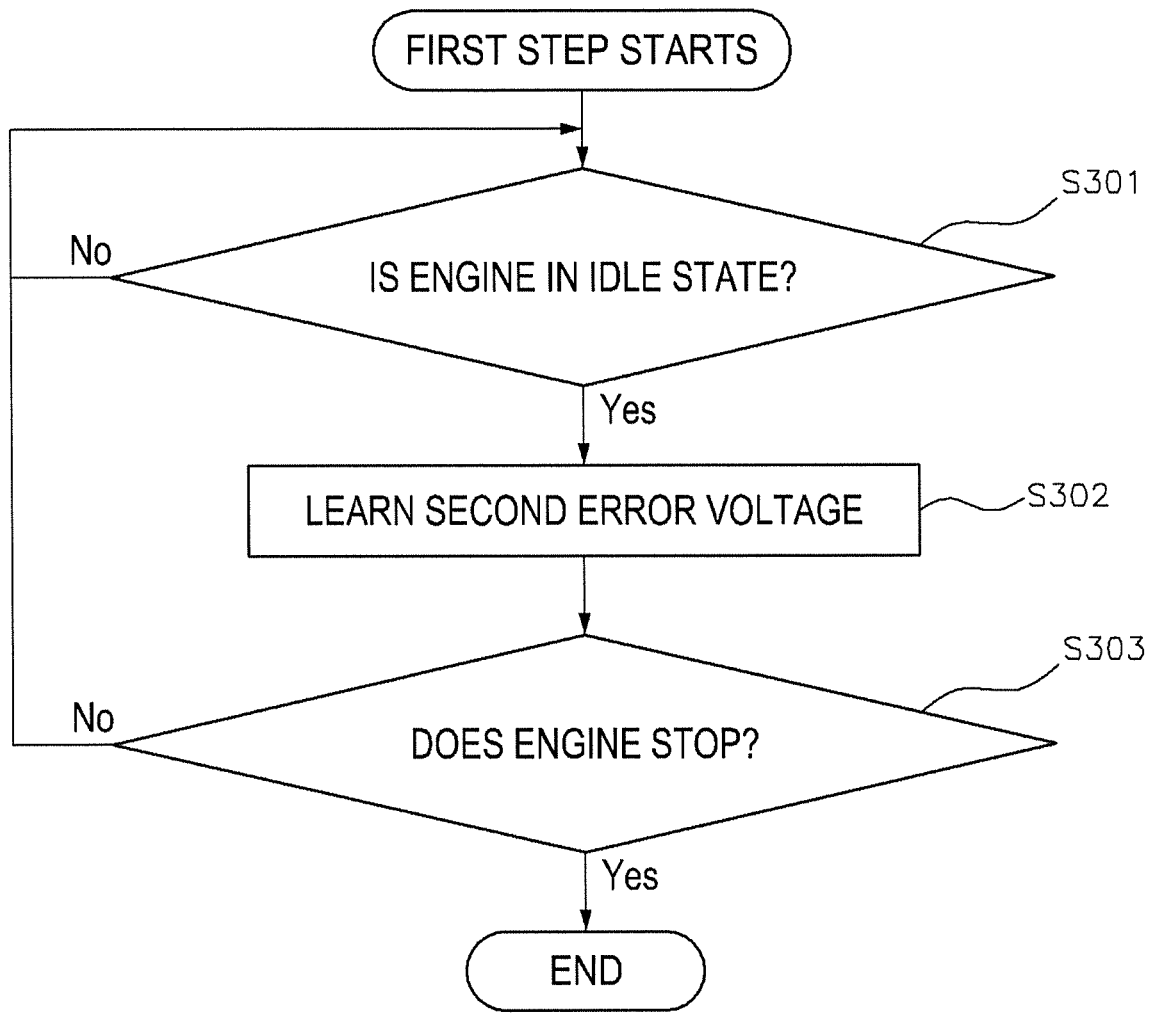
FIG. 3 is a flowchart of a step of calculating second error voltage according to the exemplary embodiment of the present disclosure.

FIG. 3 is a flowchart the step of calculating a second error voltage according to an exemplary embodiment of the present disclosure. Referring to FIG. 3, the step of calculating a second error voltage (S30) may include a process (S301) of determining whether the engine is in the idle state and may be performed in the idle state of the engine.

A reason for measuring the second error voltage only in the idle state of the engine is the same as of the reason for measuring the first error voltage. That is, the process may be performed only when the engine is in the idle state in order to measure the first error voltage by accurately measuring the power generation voltage of the alternator.

The second error voltage is updated through learning for each vehicle type and may be continuously updated according to a driving condition. The second error voltage may be updated according to a change in electric load amount or an engine warm-up condition unlike the first error voltage measured only once for the first time after the vehicle has been assembled.

The driving condition according to the exemplary embodiment of the present disclosure represents a driving time for each idle section, and the alternator output amount in the section and the second error voltage may be updated according to each driving condition.

FIG. 4 is a table of updating the second error voltage according to driving state as an exemplary embodiment of the present disclosure. Referring to FIG. 4, the second error voltage may be calculated by adding a predetermined calculated second error voltage to a value acquired by applying a weighted value to the difference between the target voltage and the actual voltage of the battery, and updated for each idle section of the engine while the vehicle is driven.

According to an exemplary embodiment of the present disclosure, the driving condition may be divided into K1 to K9 and is not particularly limited thereto and may also be changed in detail. The second error voltage may be calculated by [Equation 1] as described below and continuously updated for each idle section while the vehicle is driven.

$$K_{inew} = K_{iold} + \alpha * \text{Error} \quad [\text{Equation 1}]$$

($\alpha$: weighted value $0<\alpha<1$, Error=target battery voltage−actual battery voltage)

The weighted value may be a value which may be controlled and Ki represents the second error voltage which may be set for each section according to the driving condition.

Although the present disclosure has been described in detail through the representative exemplary embodiment hereinabove, it will be appreciated that various modifications of the exemplary embodiment of the present disclosure can be made by those skilled in the art within a limit without departing from the scope of the present disclosure. Therefore, the scope of the present disclosure should not be determined to be limited to the exemplary embodiment and should be defined by appended claims to be described below and all modifications or modified forms derived from equivalent concepts to the appended claims.

What is claimed is:

1. A learning algorithm for controlling a battery voltage, which reduces an error of the battery voltage by using a power generation voltage of an alternator while a vehicle is driven, the learning algorithm comprising steps of:
   calculating, by a processor, a first error voltage indicating a difference between the power generation voltage of the alternator and the battery voltage only once after the vehicle is assembled, when there is no learning history of calculating the first error voltage;
   calculating, by the processor, a second error voltage indicated by updating the difference between the power generation voltage of the alternator and the battery voltage according to an output amount of the alternator and a driving time; and
   calculating, by the processor, a line-to-line voltage between the alternator and the battery by adding the first error voltage and the second error voltage.

2. The learning algorithm of claim 1, wherein an error between a target voltage and an actual voltage of the battery voltage is reduced by removing the line-to-line voltage from the power generation voltage of the alternator.

3. The learning algorithm of claim 1, wherein the step of calculating a first error voltage includes
   terminating learning when there is the learning history of calculating the first error voltage and determining whether an engine is in an idle state when there is no learning history,
   wherein the first error voltage is calculated only when values of loads connected to the alternator are smaller than predetermined resistance in the idle state of the engine.

4. The learning algorithm of claim 1, wherein the step of calculating a second error voltage includes determining whether the engine is in an idle state, and is performed in the idle state of the engine.

5. The learning algorithm of claim 1, wherein the second error voltage is calculated by adding a precalculated second error voltage to a value acquired by applying a weighted value to the difference between the target voltage and the actual voltage of the battery, and updated for each idle section of the engine while the vehicle is driven.

* * * * *